United States Patent [19]

Kimura

[11] Patent Number: 5,561,392
[45] Date of Patent: Oct. 1, 1996

[54] LOGARITHMIC AMPLIFIER EMPLOYING CASCADED FULL-WAVE RECTIFIERS INCLUDING EMITTER-COUPLED PAIRS WITH UNBALANCED EMITTER DEGENERATION AS LOGARITHMIC ELEMENTS

[75] Inventor: Katsuji Kimura, Tokyo, Japan

[73] Assignee: NEC Corporation, Tokyo, Japan

[21] Appl. No.: 102,493

[22] Filed: Aug. 5, 1993

Related U.S. Application Data

[63] Continuation of Ser. No. 843,216, Feb. 28, 1992, abandoned.

[30] Foreign Application Priority Data

Feb. 28, 1991 [JP] Japan .................................. 3-057918

[51] Int. Cl.⁶ .............................. G06F 7/556; G06G 7/12
[52] U.S. Cl. .......................... 327/350; 327/351; 327/352; 327/563
[58] Field of Search .................................... 307/492, 494, 307/264; 328/61, 145; 327/350, 351, 352, 560, 563, 104, 122; 330/2, 252

[56] References Cited

U.S. PATENT DOCUMENTS

| | | | |
|---|---|---|---|
| 4,794,342 | 12/1988 | Kimura ..................................... | 330/2 |
| 4,972,512 | 11/1990 | Garskamp .............................. | 307/492 |
| 4,990,803 | 2/1991 | Gilbert .................................... | 307/492 |
| 5,049,829 | 9/1991 | Garskamp .............................. | 307/492 |
| 5,057,717 | 10/1991 | Kimura ................................... | 327/352 |
| 5,070,303 | 12/1991 | Dent ....................................... | 307/492 |
| 5,298,811 | 3/1994 | Gilbert .................................... | 327/350 |
| 5,319,264 | 6/1994 | Kimura ................................... | 327/352 |
| 5,319,267 | 6/1994 | Kimura ................................... | 327/122 |

OTHER PUBLICATIONS

Analog Dialogue, vol. 23, No. 3, 1989, by Barrie Gilbert, Bob Clarke, A. Paul Brokaw and Jeff Barrow "Monolithic DC-to-120-MHz Log-Amp is Stable and Accurate", pp. 1–9.

*Primary Examiner*—David C. Nelms
*Assistant Examiner*—Trong Phan
*Attorney, Agent, or Firm*—Sughrue, Mion, Zinn, Macpeak & Seas

[57] ABSTRACT

A logarithmic amplification circuit is provided which is composed of a differential amplifier, a plurality of full-wave rectifiers including two half-wave rectifiers connected so as to have their input signals inverse in phase to each other and respectively receiving an output signal of the differential amplifier, and an adder for adding the output signals of the full-wave rectifier. Each of the half-wave rectifiers includes a differential transistor pair only one of which has an emitter resistor. Two sets of such differential transistor pair are arranged so that the collectors of transistors with emitter resistors are connected, the collectors of transistors without emitter resistors are connected, an output signal of the differential amplifier is applied to the base of one of the transistors having an emitter resistor and one of the transistors not having an emitter resistor, another output signal of the differential amplifier is applied to the base of the other of the transistors having an emitter resistor and the other of the transistors not having an emitter resistor, and the transistors of each pair are connected, respectively, to constant current sources.

12 Claims, 7 Drawing Sheets

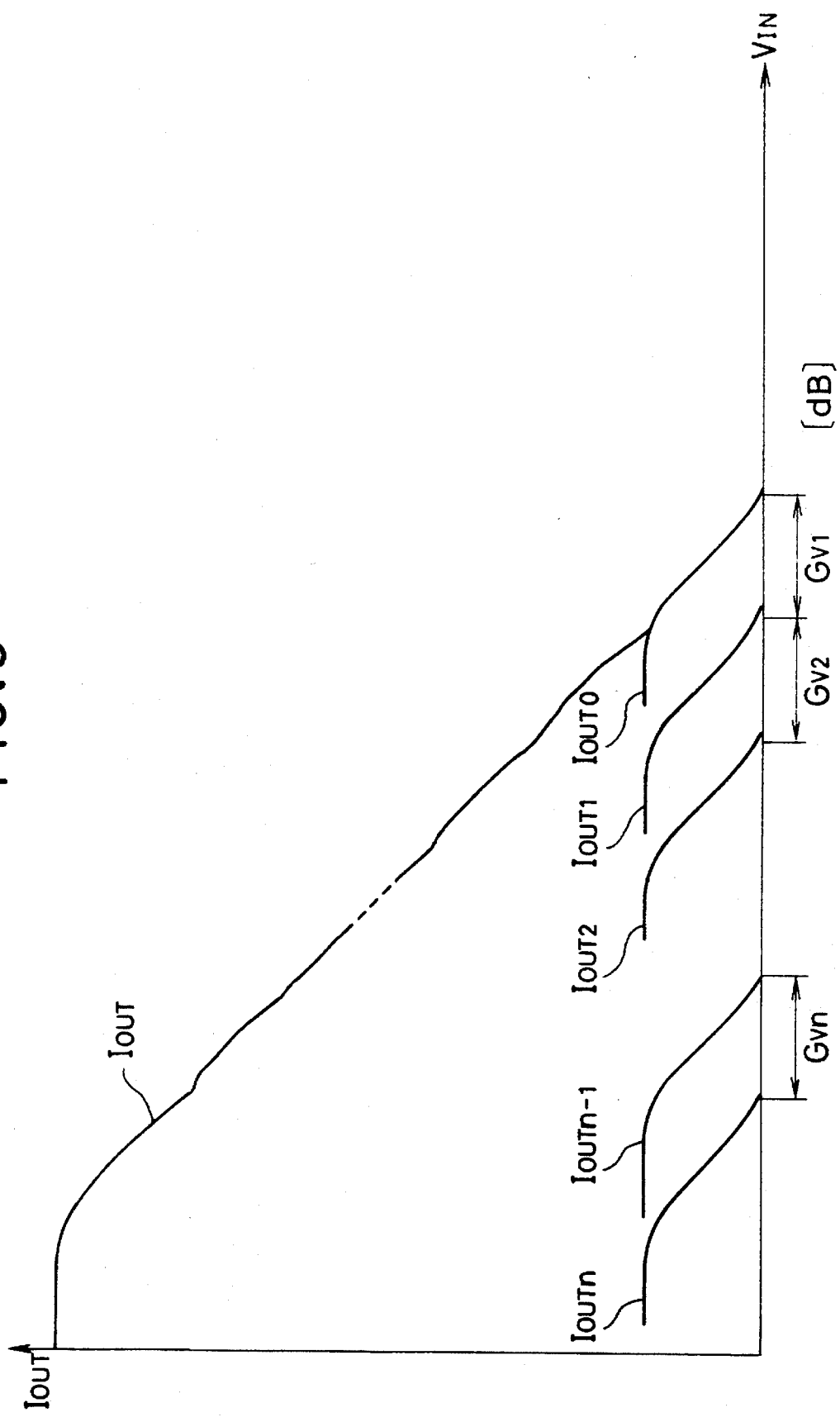

LOGARITHMIC AMPLIFIER EMPLOYING CASCADED FULL-WAVE RECTIFIERS INCLUDING EMITTER-COUPLED PAIRS WITH UNBALANCED EMITTER DEGENERATION AS LOGARITHMIC ELEMENTS

This is a Continuation of application Ser. No. 07/843,216 filed Feb. 28, 1992, now abandoned.

BACKGROUND OF THE INVENTION

1. Field of the Invention

This invention relates to a logarithmic amplification circuit.

2. Description of the Prior Art

A logarithmic amplification circuit shown in FIG. 1 is well-known as a conventional one, which is a logarithmic amplification circuit described in the Plessey Corporation's Catalogue SL521, and comprises a differential amplifier consisting of transistors TR1 and TR2 as a first stage and a half-wave rectifier consisting of a differential transistor pair TR4 and TR5 only one transistor of which has an emitter resistor RE (the emitter resistor RE is connected to the transistor TR5 in FIG. 1) as a second stage. The operational principle thereof will be explained below.

In FIG. 1, if an electric current to be flowed into a resistor R1 is expressed as I0, a voltage to be applied between the transistors TR4 and TR5 is expressed as VB4,5, base voltages of the transistors TR4 and TR5 are respectively expressed as VBE4 and VBE5, collector currents of the transistors TR4 and TR5 are respectively expressed as Ic4 and Ic5 and its current amplification factor is expressed as αF, the following equation is established;

$$VB4,5 + VBE4 + (Ic5/\alpha F)RE - VBE5 = 0 \quad (1)$$

In Eq. (1), if $kT/q = VT$, where k is Boltzmann's constant, T is an absolute temperature, and q is a unit electron charge, then, there exists the following relationships between the VT and the base voltages VBE4 and VBE5 of respective transistors TR4 and TR5:

$$VBE4 \gg VT, \quad VBE5 \gg VT.$$

In addition, if saturation currents of the differential transistor pair TR4 and TR5 are respectively expressed as Is4 and Is5, the following equations are satisfied as;

$$VBE4 = VT \cdot \ln(Ic4/Is4) \quad (2)$$

$$VBE5 = VT \cdot \ln(Ic5/Is5) \quad (3)$$

Here, by substituting Eqs. (2) and (3) into Eq. (1) and supposing that the transistors TR4 and TR5 are identical (i.e., as Is4=Is5), Eq. (1) may be explained as follow:

$$VB4,5 + VT \cdot \ln(Ic4/Ic5) + (Ic5/\alpha F)RE = 0 \quad (4)$$

On the other hand, there exists the following relationship between the current I0 to be flowed into the resistor R1 and the collector currents Ic4 and Ic5:

$$\alpha F \cdot I0 = Ic4 + Ic5 \quad (5)$$

Hence, by eliminating Ic4 using Eq. (5), Eq. (4) may be explained by the following:

$$VB4,5 + VT \cdot \ln[(\alpha F \cdot I0/Ic5) - 1] + (Ic5/\alpha F)RE = 0 \quad (6)$$

Next, in order to obtain the slope of a curve showing the change of the collector current Ic5 with the change in inter-base voltage VB4,5 of the differential transistor pair TR4 and TR5, the Ic5 in Eq. (6) is differentiated with respect to VB4,5, and the following equation may be obtained:

$$\frac{dIc5}{dVB4,5} = -\frac{1}{VT \cdot \frac{Ic5(\alpha F \cdot I0 - Ic5)}{\alpha F \cdot I0} + \frac{RE}{\alpha F}} \quad (7)$$

The absolute value of Eq. (7) can be maximized when the denominator becomes minimum, that is, in case of being established the following equation (the same manner may be used with respect to Ic4):

$$Ic5 = Ic4 = (\tfrac{1}{2}) \alpha F \cdot I0 \quad (8)$$

Thus, the maximum absolute value may satisfy the following equation:

$$\left| \frac{dIc5}{dVB4,5} \right| Ic5 = (1/2)\alpha F \cdot I0 = \frac{\alpha F \cdot I0}{4VT + RE \cdot I0} \quad (9)$$

An inter-base voltage VB4,5 in this case becomes as follows:

$$VB4,5 = (-\tfrac{1}{2})RE \cdot I0 \quad (10)$$

FIG. 2 shows a relation of a voltage between the bases VB4,5 and the collector current Ic5. As seen from FIG. 2, in order to obtain a half-wave rectification characteristic in the conventional logarithmic amplification circuit as described above, the inter-base voltage VB4,5 is required to be provided with a voltage offset of about 4VT (about 100 mV). Therefore, using the conventional logarithmic amplification circuit it is unavoidably necessary to have a circuit for providing a voltage offset to the differential input voltage (VB4,5), which means that there exists such a problem that not only the input circuit is complicated, but also to dynamic range is difficult to be expanded. In addition, it utilizes the half-wave rectification characteristic, resulting in arising a problem that amplification is difficult to be carried out with high accuracy.

Thus, an object of this invention is to provide a logarithmic amplification circuit which has a simple input circuit and a wide dynamic range as compared with conventional ones.

Another object of this invention is to provide a logarithmic amplification circuit capable of performing high accuracy amplification.

SUMMARY OF THE INVENTION

A logarithmic amplification circuit of this invention characteristically comprises a differential amplifier, a full-wave rectifier including two half-wave rectifiers connected so as to have their input signals inverse in phase to each other and respectively receiving an input signal and output signal of said differential amplifier, and an adder for adding the output signals of said full-wave rectifier. By utilizing the full-wave rectifier as shown above, a voltage offset can be eliminated, so that an input circuit can be made simple in structure, and by lowering the lower limit, the dynamic range can be further widened.

Each of the two half-wave rectifiers forming said full-wave rectifier is preferable to include a differential transistor pair only one transistor of which has an emitter resistor. In this case, these two differential transistor pairs forming the half-wave rectifier are preferable to be arranged so that the transistors each having an emitter resistor have their collectors connected in common, the transistors each not having an emitter resistor have their collectors connected in common, one of an output signal and an input signal of said differential amplifier is applied to the base of one of the transistors each having an emitter resistor and one of the transistors each not having an emitter resistor, the other of an output signal and input signal of said differential amplifier is applied to the base of the other of the transistors each having an emitter resistor and the other of the transistors each not having an emitter resistor, and the transistors of each pair are connected respectively to constant current sources. Thus, by utilizing two sets of differential transistor pairs, the characteristic dispersion of the components of the circuit can be set off, being possible to effect high accuracy amplification.

In the preferred embodiments of this invention, a logarithmic amplification circuit comprises n differential amplifiers (n is an integer of two or more), (n+1) full-wave rectifiers each consisting of two half-wave rectifiers whose input signals are inverse in phase to each other, in which one of the (n+1) full-wave rectifiers receives an input signal to a first one of the n differential amplifiers and the other full-wave rectifiers receive the output signals from the n differential amplifiers in a respective manner, and an adder for adding the output signals from the (n+1) differential rectifiers.

Further in the preferred embodiments, a logarithmic full-wave rectifier is used as the full-wave rectifier. In this invention, the logarithmic full-wave rectifier comprises two sets of differential transistor pairs only one transistor of which has an emitter resistor. A plurality of logarithmic full-wave rectifiers as shown above are provided so as to be different in the product of a resistance value of the emitter resistor and a current value of the constant current source from each other and connected in series to each other. As a result, even if the number of stages of the differential amplifiers is reduced, a wide dynamic range and high accuracy amplification can be provided.

BRIEF DESCRIPTION OF THE DRAWINGS

FIG. 9 is a characteristic diagram showing a relationship between an input voltage Vi and an output current IOUT of a logarithmic amplification circuit using the logarithmic full-wave rectifier shown in FIG. 7.

DESCRIPTION OF THE PREFERRED EMBODIMENTS

Preferred embodiments of this invention will be described below while referring to FIGS. 3 to 9.

Figure 3:
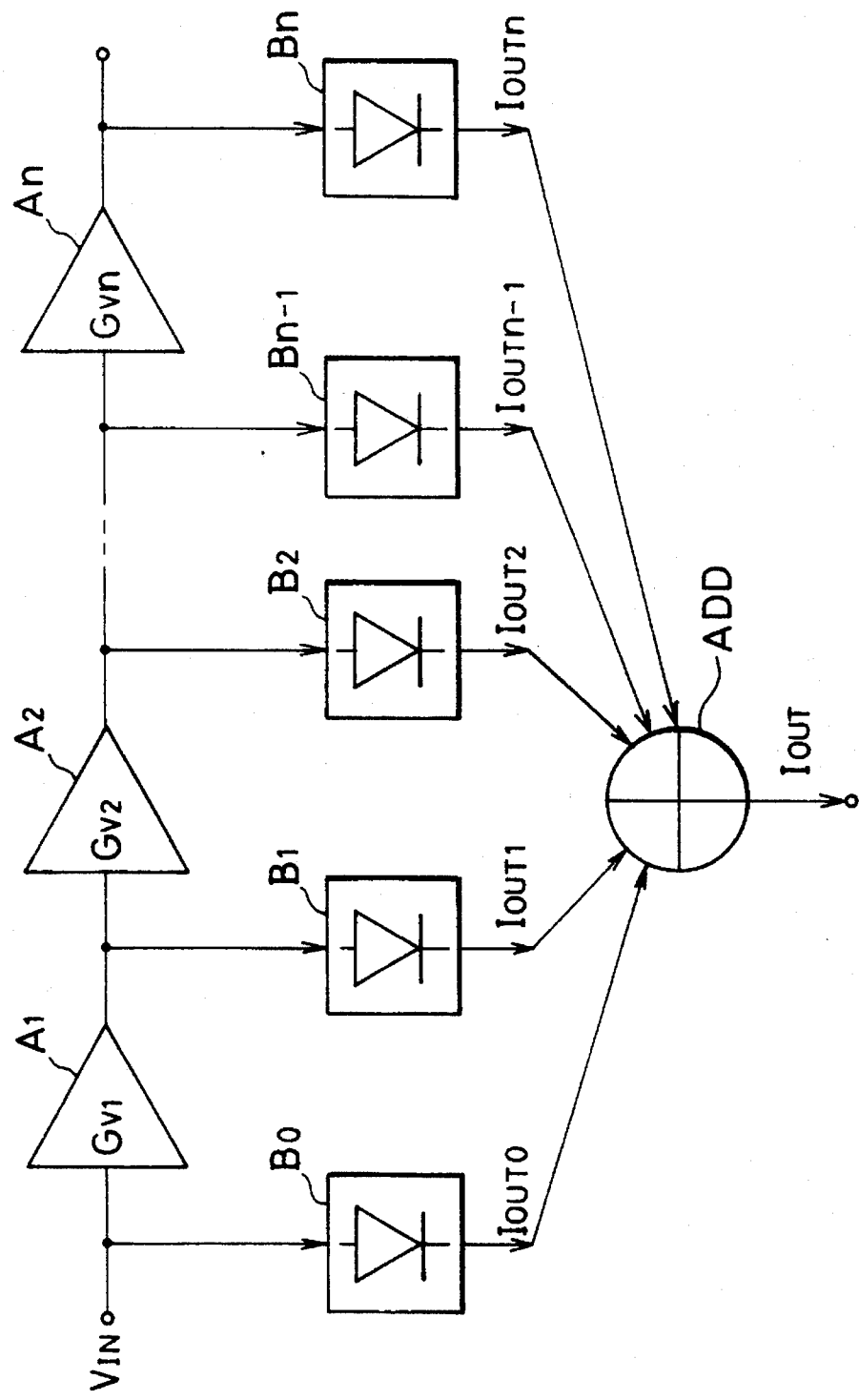
FIG. 3 is a block diagram of a logarithmic amplification circuit according to one embodiment of this invention.

FIG. 3 schematically shows a logarithmic amplification circuit according to one embodiment of this invention. The logarithmic amplification circuit shown in FIG. 3 comprises n differential amplifiers A1 to An (gains GV1 to GVn) connected in series, a full-wave rectifier $B_0$ receiving an input signal for rectification, n full-wave rectifiers B1 to Bn respectively receiving output signals from the respective differential amplifiers A1 to An for rectification, and an adder ADD for adding the output currents IOUT0 to IOUTn from the (n+1) full-wave rectifiers B0 to Bn. The rectifier B0 receives the same input signal that is input to the differential amplifier A1, the rectifiers B1 to Bn receive output signals output from the differential amplifiers A1 to An, respectively. The adder ADD adds the outputs IOUT0 through IOUTn outputted respectively from the (n+1) rectifiers B0 to Bn, and generates an output current IOUT.

Figure 4:
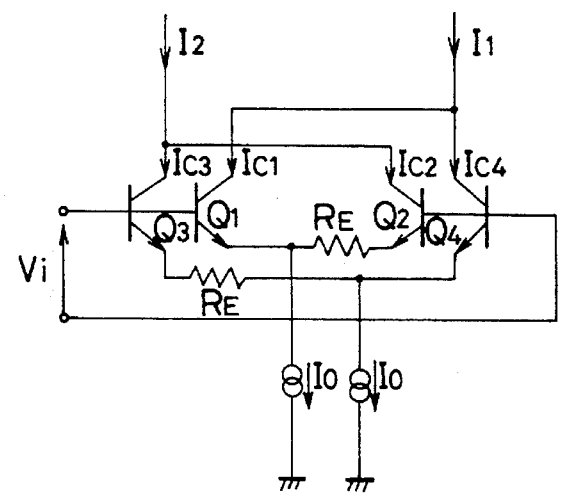
FIG. 4 is a block diagram of a full-wave rectifier to be used in the circuit shown in FIG. 3 according to the embodiment of this invention.

The full-wave rectifiers B0 to Bn are each arranged as shown in FIG. 4. In FIG. 4, an input voltage Vi (i=0, 1, 2, . . . , n) corresponds to each of the input voltages to the rectifiers B0 to Bn; in other words, the input voltage V0 (i=0) corresponds to the input voltage VIN to the differential amplifier A1, and the input voltages V1 (i=1) to Vn (i=n) respectively correspond to the output voltages from the differential amplifiers A1 to An. Transistors Q1 and Q2 form a first differential transistor pair whose emitters are connected with each other through an emitter resistor, and transistors Q3 and Q4 form a second differential transistor pair whose emitters are connected with each other through an emitter resistor. In these first and second transistor pairs, each of the transistors Q2 and Q3 only have an emitter resistor. The collectors of the transistors Q2 and Q3 each having an emitter resistor are connected with each other, while the collectors of the transistors Q1 and Q4 each not having an emitter resistor are also connected with each other. The bases of the transistor Q1 not having an emitter resistor are connected together, and the transistor Q3 having an emitter resistor and the bases of the transistor Q2 having an emitter resistor and the transistor Q4 not having an emitter resistor are connected with each other. A differential input voltage Vi, which is the same input signal sent to a subsequent differential amplifier from a preceding differential amplifier, is applied between the common collectors. The differential transistor pairs Q1, Q2 and Q3, Q4 are connected respectively to constant power sources I0.

Figure 1:
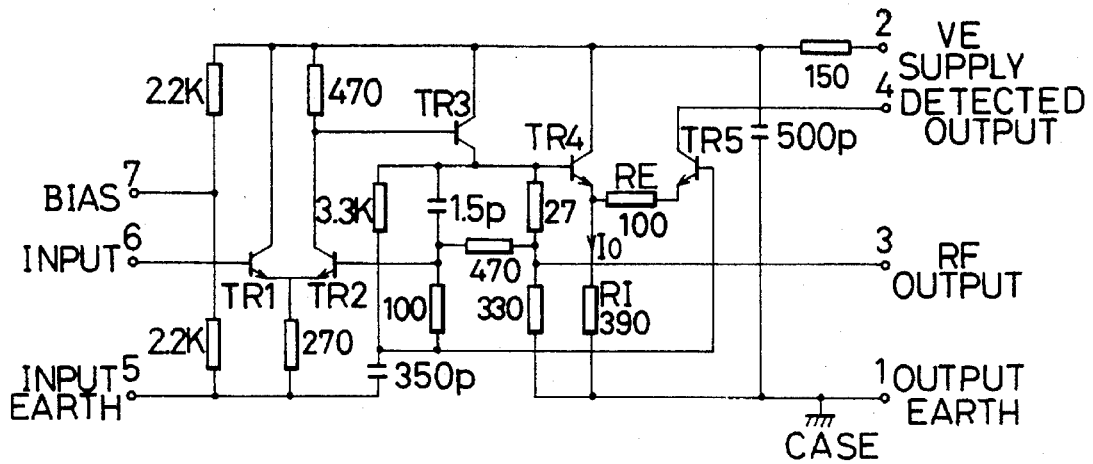
FIG. 1 is a block diagram of a conventional logarithmic amplification circuit.
Figure 2:
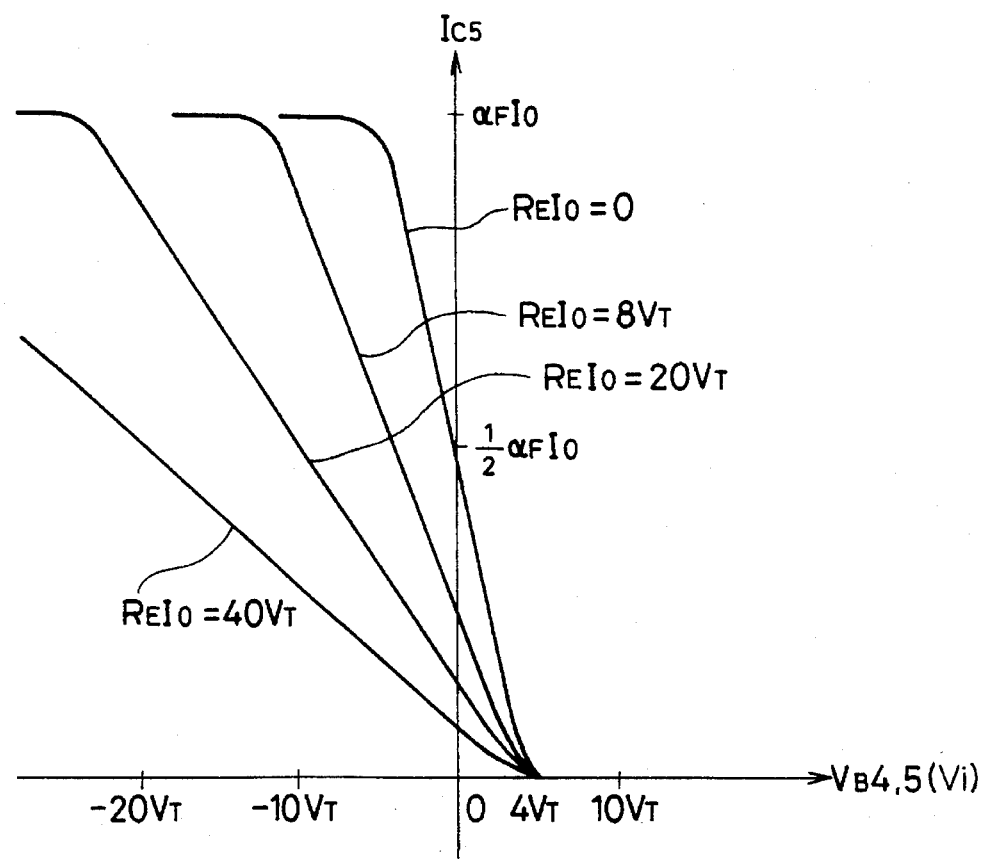
FIG. 2 is a characteristic diagram showing a relationship between an inter-base voltage VB4,5 and a collector current Ic5 of the conventional circuit shown in FIG. 1.

As seen from FIG. 4, this full-wave rectifier includes two differential transistor pairs which only one of the transistors of each pair has an emitter resistor, each differential transistor pair has the same structure as the circuit shown in FIG. 1, and their inputs are connected inversely to each other. Namely, these are arranged so that an input signal of the second differential transistor pair Q3 and Q4 is made inverse in phase to an input signal of the first differential transistor pair Q1 and Q2. As a result, respective collector currents Ic1, Ic2, Ic3, and Ic4 of the transistors Q1, Q2, Q3 and Q4 are varied equally to those shown in FIG. 2 (see FIG. 5).

Thus, if the output signals of the first and second transistor pairs are expressed as I1 and I2, the following are established:

$$I1=Ic1+Ic4$$

$$I2=Ic2+Ic3$$

Figure 6:
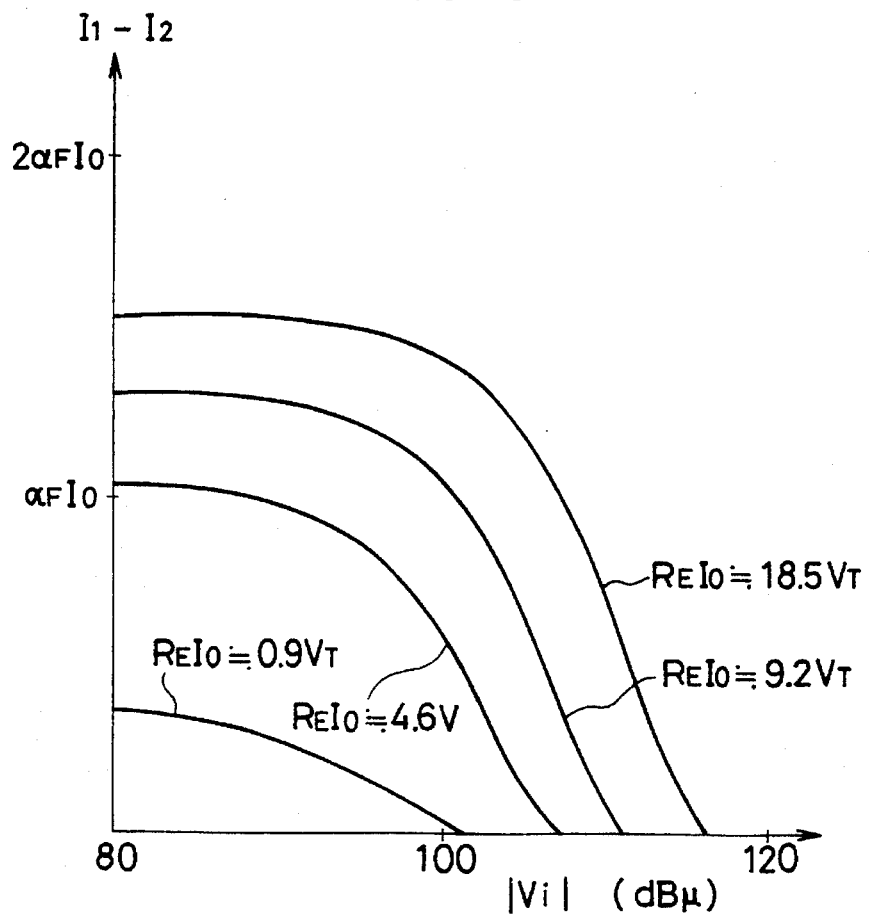
FIG. 6 is a characteristic diagram showing a relationship between the absolute value of an input voltage V1 and an output current difference (I1–I2) of the full-wave rectifier shown in FIG. 4.
Figure 5:
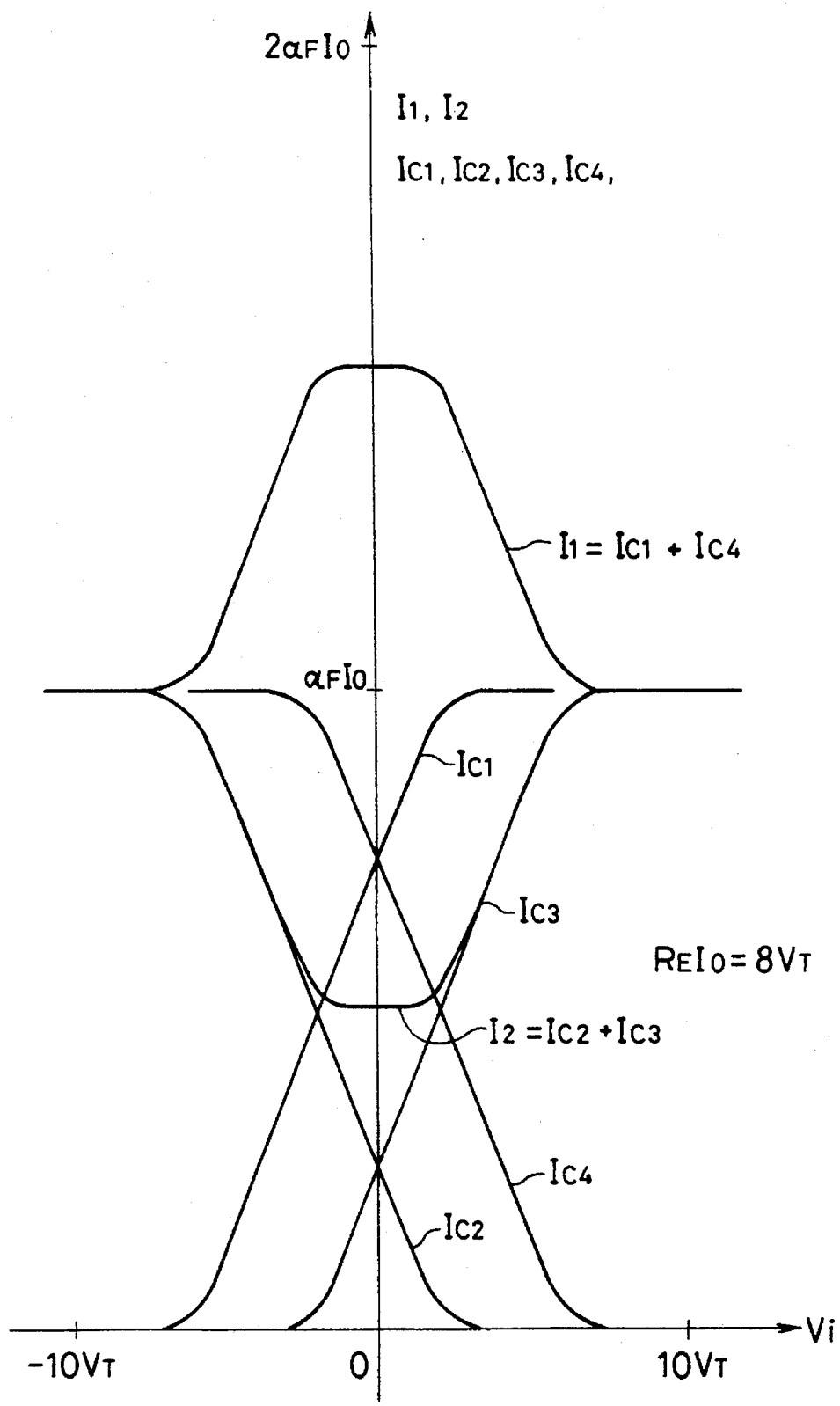
FIG. 5 is a characteristic diagram showing the relationships among an input voltage Vi, output currents I1 and I2, and collector currents Ic1, Ic2, Ic3 and Ic4 of the full-wave rectifier shown in FIG. 4.

As a result, the changes of the output currents I1 and I2 with the input voltage Vi will as shown in FIG. 5. Referring to FIG. 5, the output currents I1 and I2 each has a characteristic such that it is turned back at the point of the input voltage Vi=0 (symmetric characteristic), which means that the circuit shown in FIG. 4 has a full-wave rectification characteristic and yet requires no offset. In addition, it can be found from FIG. 5 that there exist the relationship as shown in FIG. 6 between the absolute value of the input voltage Vi (in dB unit) and the output current difference (I1−I2).

Figure 7:
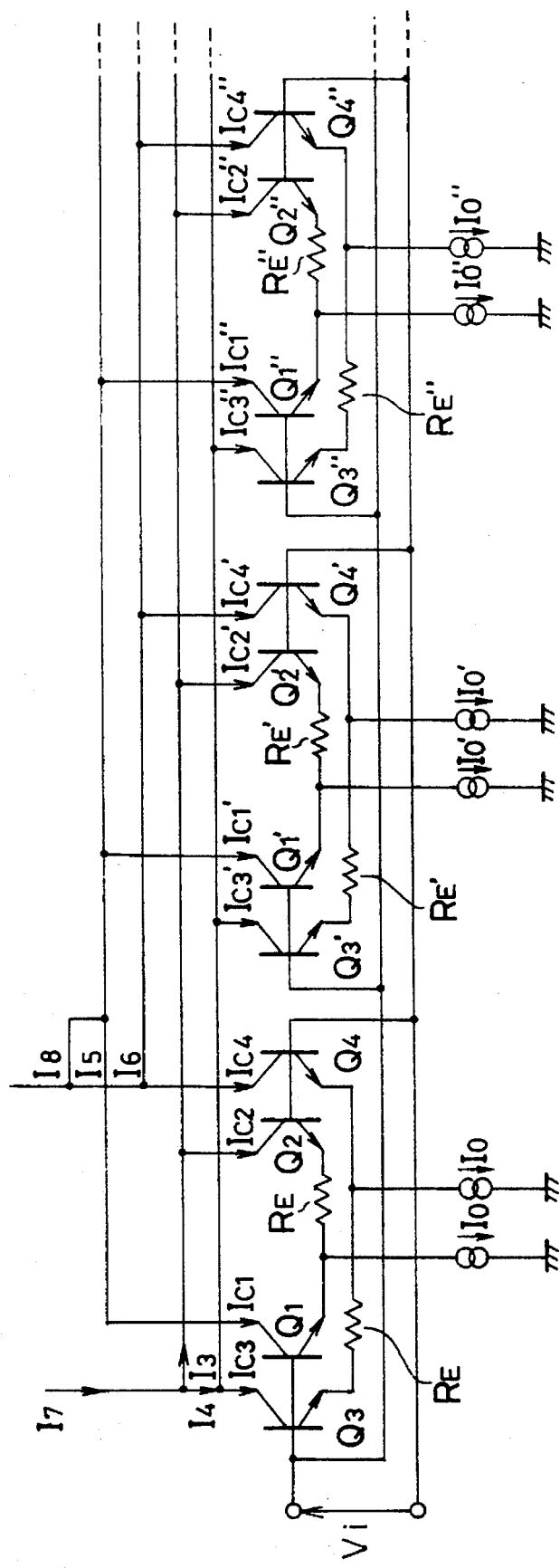
FIG. 7 is a block diagram of another example of the logarithmic full-wave rectifier to be used in the circuit shown in FIG. 3 according to the embodiment of this invention.

FIG. 7 shows another arrangement of the (n+1) full-wave rectifiers B0 to Bn shown in FIG. 3. The logarithmic full-wave rectifier circuits shown in FIG. 7 may be employed as any one of the full-wave rectifier circuits B0 to Bn as shown in FIG. 3. In FIG. 7, similar to FIG. 4, the input voltage Vi (i=0, 1, 2, ..., n) corresponds to each of the input voltages to the rectifiers B0 to Bn. In other words, the input voltage V0 (i=0) corresponds to the input voltage $V_{IN}$ inputted to the differential amplifier A1, and the input voltages Vi (i=1) to VN (i=n) respectively correspond to the output voltages from the differential amplifiers A1 to An. The circuit shown in FIG. 7 is a pseudo logarithmic full-wave rectifier including a plurality of full-wave rectifiers shown in FIG. 4 connected in parallel, which respectively have emitter resistor having different resistance values RE, RE', RE", ... from each other, and constant current sources having different current values I0, I0', I0", ... from each other. For the sake of convenience, in FIG. 7, a first full-wave rectifier including a differential transistor pair Q1 and Q2 and a differential transistor pair Q3 and Q4, a second full-wave rectifier including a differential transistor pair Q1' and Q2' and a differential transistor pair Q3' and Q4', and a third full-wave rectifier including a differential transistor pair Q1" and Q2" and a differential transistor pair Q3" and Q4" are shown. The input voltage Vi is applied between the common bases of each full-wave rectifier, that is, in the first rectifier, it is applied between the common base of the transistors Q1 and Q3 and the common base of the transistors Q2 and Q4, in the second rectifier, it is applied between the common base of the transistors Q1' and Q3' and the common base of the transistors Q2' and Q4', and in the third rectifier, it is applied between the common base of the transistors Q1" and Q3" and the common base of the transistors Q2" and Q4".

With the circuit shown in FIG. 7, if the product of a resistance value of the emitter resistor and a current value of the constant current source in the rectifier at each stage is set to be larger than that at the preceding stage, namely, set to be as (RE·I0)<(RE'·I0')<(RE"·I0")< . . . , and if a current value of the constant current source in the rectifier at each stage is set similarly to the above, namely, set to be as I0<I0'<I0"< . . . , the output currents I3 and I4 shown in FIG. 7 may be expressed by the following equations:

$$I3=Ic2+Ic2'+Ic2''+ \ldots \quad (11)$$

$$I4=Ic3+Ic3'+Ic3''+ \ldots \quad (12)$$

Figure 8:
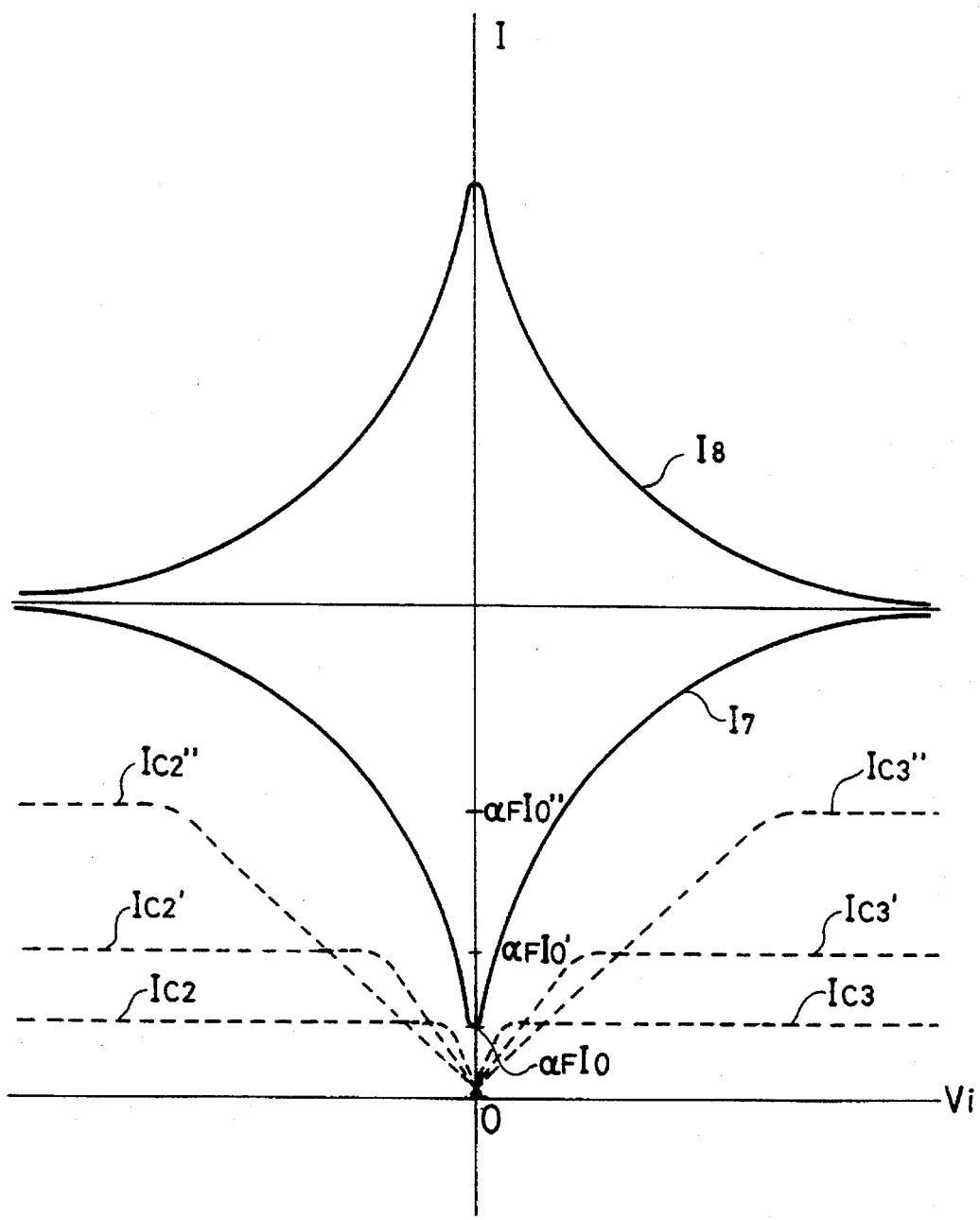
FIG. 8 is a characteristic diagram showing the relationships among an input voltage Vi, output currents I1 and I2, and collector currents Ic2, Ic2', Ic2", Ic3, Ic3' and Ic3" of the logarithmic full-wave rectifier shown in FIG. 7.

The output currents making up I3 and I4 are logarithmic in characteristic and can be approximated by the dotted lines in the negative range and the positive range of the input voltage Vi, respectively (see FIG. 8). Thus, if the output current I7 is defined as:

$$I7=I3+I4,$$

the change of I7 becomes as shown in FIG. 8. This shows that the circuit shown in FIG. 7 has a logarithmic full-wave rectification characteristic. Particularly, in the range of being $$Vi>4 \, VT \quad (14),$$

this rectification characteristic has the positive range and negative range of Vi symmetrical with respect to each other.

In addition, if the resistance values of the emitter-resistors (RE, RE', RE" . . . ) and the current values of the constant current sources (I0, I0', I0" . . . ) are selected appropriately, the I7 can be approximated to the logarithmic full-wave rectification characteristic even when the condition shown by Eq. (14) is not existed.

The output currents I5 and I6 shown in FIG. 7 can be expressed by the following equations similar to the case of the output currents I3 and I4 as:

$$I5=Ic1+Ic1'+Ic1''+ \ldots \quad (15)$$

$$I6=Ic4+Ic4'+Ic4''+ \ldots \quad (16)$$

Thus, if the output current I8 is defined as;

$$I8=I5+I6 \quad (17),$$

the change of I8 becomes as shown in FIG. 8.

The output currents I7 and I8 are inverse in phase to each other, so that the output current I8 also can be approximated to a logarithmic characteristic similar to the case shown above. As a result, the circuit shown in FIG. 7 has a logarithmic full-wave rectification characteristic as shown in FIG. 8.

In this case, the n differential amplifiers A1, A2, ..., and An connected in series shown in FIG. 3 have the gains [dB] GV1, GV2, ..., and GVn, respectively, however, if a signal having a large amplitude is inputted, the output is saturated, resulting in effecting a limiting operation. As a result, by using the full-wave rectifier as shown in FIG. 4 as each of the rectifiers B0, B1, ... and Bn and adding the respective outputs IOUT0 to IOUTn to each other through the adder ADD, the output current IOUT thereof has a logarithmic amplification characteristic as shown in FIG. 9. Namely, the circuit shown in FIG. 3 is a logarithmic amplification circuit. This logarithmic amplification circuit can eliminate a voltage offset, so that an input circuit can be made simple, and yet the dynamic range can be widened by lowering the lower limit thereof. In addition, each of the rectifiers B0, B1, ... , and Bn uses two sets of differential transistor pairs, so that a dispersion in characteristic of components can be set off to each other, being possible to effect high accuracy amplification.

The logarithmic amplification characteristic of the output current IOUT of the logarithmic amplification circuit of this invention can be improved by appropriately selecting each of the gains GV1, GV2, . . . , and GVn of respective differential amplifiers A1, A2, . . . , and An, and the current value of the constant current source I0, the resistance value of the emitter resistor RE and the current amplification factor α F of each of the full-wave rectifiers B0, B1, . . . , and Bn. For example, by lowering the gains GV1, GV2, . . . , and GVn of respective differential amplifiers A1, A2, . . . , and An, the logarithmic characteristic can be improved. On the other hand, however, this disadvantageously results in a decrease in dynamic range of the output. If the gain of each differential amplifier is selected at a level of 20 dB in general, the dynamic range of the full-wave rectifier shown in FIG. 4 is only at a level of about 10 dB as shown in FIG. 6, so that the logarithmic output IOUT becomes irregular, resulting in being inferior in linearity.

As a result, by using the logarithmic full-wave rectifier shown in FIG. 7 instead of the full-wave rectifier shown in FIG. 4, the dynamic range can be expanded while improving the logarithmic characteristic. Therefore, even if the number of stages of the differential amplifiers to be used is reduced, a high accuracy logarithmic amplification circuit with a wide dynamic range can be realized.

What is claimed is:

1. A logarithmic amplification circuit for amplifying an initial input signal comprising:

(a) a differential amplifier producing an output signal in response to said initial input signal;

(b) a first full-wave rectifier for rectifying said initial input signal and for generating a first rectified output signal, said first full-wave rectifier including identical first and second half-wave rectifiers connected so that said initial input signal is applied to said first and second half-wave rectifiers inverse in phase relative to each other;

said first and second half-wave rectifiers including respective differential transistor pairs consisting of first and second transistors, and third and fourth transistors, respectively, wherein emitter areas of said first and second transistors are equal, and emitter areas of said third and fourth transistors are equal;

wherein each of said second and third transistors has an emitter resistor, said second and third transistors being connected together by their respective collectors, said first and fourth transistors being connected together by their respective collectors, said first and third transistors being connected together by their respective bases, said second and fourth transistors being connected together by their respective bases, and wherein said initial input signal is received between said bases of said first and third transistors and said bases of said second and fourth transistors, and (c) a second full-wave rectifier for rectifying said output signal of said differential amplifier and for generating a second rectified output signal, said second full-wave rectifier including identical third and fourth half-wave rectifiers connected so that said output signal of said differential amplifier is applied to said third and fourth half-wave rectifiers inverse in phase relative to each other, said third and fourth half-wave rectifiers including respective differential transistor pairs consisting of fifth and sixth transistors, and seventh and eighth transistors, respectively, wherein emitter areas of said fifth and sixth transistors are equal and emitter areas of said seventh and eighth transistors are equal;

wherein each of said sixth and seventh transistors has an emitter resistor, said sixth and seventh transistors being connected together by their respective collectors, said fifth and eighth transistors being connected together by their respective collectors, said fifth and seventh transistors being connected together by their respective bases, said sixth and eighth transistors being connected together by their respective bases, and wherein said output signal of said differential amplifier is received between said bases of said fifth and seventh transistors and said bases of said sixth and eighth transistors; and (d) an adder for adding the first and second rectified output signals of said first and second full-wave rectifiers.

2. A logarithmic amplification circuit for amplifying an initial input signal comprising:

(a) a differential amplifier producing an output signal in response to said initial input signal;

(b) a first logarithmic element comprising a first plurality of full-wave rectifiers for rectifying said initial input signal and for generating a first rectified output signal, each of said plurality of full-wave rectifiers comprising:

identical first and second half-wave rectifiers, each including respective differential transistor pairs consisting of first and second transistors, and third and fourth transistors, respectively, wherein emitter areas of said first and second transistors are equal and emitter areas of said third and fourth transistors are equal;

wherein each of said second and third transistors has an emitter resistor, said second and third transistors being connected together by their respective collectors, said first and fourth transistors being connected together by their respective collectors, said first and third transistors being connected together by their respective bases, said second and fourth transistors being connected together by their respective bases, each of said plurality of said full-wave rectifiers receiving said initial input signal between said bases of each of said first and third transistors and said bases of each of said second and fourth transistors, and first constant current sources for supplying electric currents to said first and second half-wave rectifiers, respectively, wherein each of said full-wave rectifiers has a unique product of a resistance value of said emitter resistor and a current value of said constant current source;

(c) a second logarithmic element comprising a second plurality of full-wave rectifiers for rectifying said output signal of said differential amplifier and for generating a second rectified output signal, each of said second plurality of full-wave rectifiers including:

identical third and fourth half-wave rectifiers, each including respective differential transistor pairs consisting of fifth and sixth transistors, and seventh and eighth transistors, respectively, wherein emitter areas of said fifth and sixth transistors are equal and emitter areas of said seventh and eighth transistors are equal;

wherein each of said sixth and seventh transistors has an emitter resistor, said sixth and seventh transistors being connected together by their respective collectors, said fifth and eighth transistors being connected together by their respective collectors, said fifth and seventh transistors being connected together by their respective bases, said sixth and eighth transistors being connected together by their respective bases, each of said second plurality of said full-wave rectifiers receiving said output signal of said differential amplifier between said bases of each of said fifth and seventh transistors and said bases of each of said sixth and eighth transistors; and second constant current sources for supplying electric currents to said third and fourth half-wave rectifiers;

wherein each of said third and fourth half-wave rectifiers has a unique product of resistance value of an emitter resistor and a current value of said second constant current source; and (d) an adder for adding said first and second rectified output signals of said first and second logarithmic elements.

3. A logarithmic amplification circuit for amplifying an initial input signal comprising:

(a) n differential amplifiers cascade connected, a first one of said n amplifiers producing an output signal in response to said initial input signal, and the remaining n−1 of said n amplifiers respectively producing output signals in response to an amplified output signal by a preceding one of said amplifiers, wherein n is an integer greater than or equal to two;

(b) n+1 full-wave rectifiers, a first one of said n+1 full-wave rectifiers rectifying said initial input signal and producing a first rectified output signal, and the remaining n of said n+1 full-wave rectifiers respectively rectifying said output signals of said n differential amplifiers and producing n respective rectified signals, wherein each of said n+1 full-wave rectifiers comprises identical first and second half-wave rectifiers connected so that said initial input signal is applied to said first and second half-wave rectifiers inverse in phase relative to each other, said first and second half-wave rectifiers including respective differential transistor pairs consisting of first and second transistors, and third and fourth transistors, respectively, wherein emitter areas of said first and second transistors are equal and emitter areas of said third and fourth transistors are equal;

wherein each of said second and third transistors has an emitter resistor, said second and third transistors being connected together by their respective collectors, said first and fourth transistors being connected together by their respective collectors, said first and third transistors being connected together by their respective bases, said second and fourth transistors being connected together by their respective bases, and wherein said initial input signal is received between said bases of said first and third transistors and said bases of said second and fourth transistors of said full-wave rectifier which rectifies said initial input signal, and said output signals of said n differential amplifiers are respectively received between said bases of said first and third transistors and said bases of said second and fourth transistors of said n full-wave rectifiers; and (c) an adder for adding said rectified output signals of said n+1 full-wave rectifiers.

4. A logarithmic amplification circuit for amplifying an initial input signal comprising:

(a) n differential amplifiers cascade connected, a first one of said n amplifiers producing an output signal in response to said initial input signal, and the remaining n−1 of said amplifiers respectively producing output signals in response to an amplified output signal by a preceding one of said amplifiers, wherein n is an integer greater than or equal to two;

(b) n+1 logarithmic full-wave rectifiers, a first one of said n+1 full-wave rectifiers rectifying said initial input signal and producing a first rectified output signal, and the remaining n of said n+1 full-wave rectifiers respectively rectifying said output signals of said n differential amplifiers and producing n respective rectified signals, wherein each of said n+1 logarithmic full-wave rectifiers comprises a plurality of full-wave rectifiers, a first one of said n+1 logarithmic full-wave rectifiers rectifying said initial input signal and generating a rectified output signal, and the remaining n of said n+1 logarithmic full-wave rectifiers respectively rectifying said output signals of said n differential amplifiers and generating n respective rectified output signals, and wherein each of said plurality of said full-wave rectifiers comprises identical first and second half-wave rectifiers connected so that said initial input signal is applied to said first and second half-wave rectifiers inverse in phase relative to each other, said first and second half-wave rectifiers including:

respective differential transistor pairs consisting of first and second transistors, and third and fourth transistors, respectively, wherein emitter areas of said first and second transistors are equal and emitter areas of said third and fourth transistors are equal;

wherein each of said second and third transistors has an emitter resistor, said second and third transistors being connected together by their respective collectors, said first and fourth transistors being connected together by their respective collectors, said first and third transistors being connected together by their respective bases, said second and fourth transistors being connected together by their respective bases, and wherein said initial input signal is concurrently received between said bases of said first and third transistors and said bases of said second and fourth transistors of said respective full-wave rectifiers of said first one of said n+1 logarithmic full-wave rectifiers, and wherein said output signal of each of said n differential amplifiers is concurrently received between said bases of said first and third transistors and said bases of said second and fourth transistors of said respective full-wave rectifiers of each of the remaining n of said n+1 logarithmic full-wave rectifiers, and constant current sources for supplying electric currents to each of said first and second half-wave rectifiers, respectively;

wherein each of said plurality of full-wave rectifiers in said n+1 logarithmic full-wave rectifiers has a unique product of a resistance value of said respective emitter resistors and a current value of said respective constant current sources; and (c) an adder for adding the rectified output signals from said n+1 logarithmic full-wave rectifiers.

5. A logarithmic amplifier for amplifying an initial input signal, comprising:

(a) an amplifier for amplifying an input signal and for outputting an amplified input signal;

(b) a first logarithmic element for rectifying said initial input signal and for producing an output signal which varies substantially logarithmically as a function of said initial input signal, wherein said first logarithmic element comprises a plurality of full-wave rectifiers receiving said initial input signal, each of said full-wave rectifiers including two identical half-wave rectifiers, wherein each of said plurality of full-wave rectifiers has a unique operating range to produce a plurality of different rectified output signals in response to said initial input signal;

(c) a second logarithmic element for rectifying said amplified input signal from said amplifier and for producing an amplified output signal which varies substantially logarithmically as a function of said amplified input signal, wherein said second logarithmic element comprises:

a plurality of full-wave rectifiers receiving said amplified input signal, each of said full-wave rectifiers including two identical half-wave rectifiers, each comprising differential transistor pairs, emitter areas of each transistor of said differential transistor pairs having the same emitter area, wherein each of said plurality of full-wave rectifiers has a unique operating range to produce a plurality of different rectified output signals in response to said amplified input signal; and an adding means for adding said plurality of said rectified output signals from said first and second logarithmic elements.

6. A logarithmic amplifier as claimed in claim 5, wherein each of said full-wave rectifiers includes two identical emitter-coupled transistor pairs with unbalanced emitter degeneration through emitter-degeneration resistors, and wherein each of said emitter-degeneration resistor is unique for each of said plurality of full-wave rectifiers.

7. A logarithmic amplifier as claimed in claim 6, wherein said amplifier is a differential amplifier for outputting a differential output signal as said amplified input signal, said full-wave rectifiers being coupled to said differential amplifier to receive said differential output signal, on their respective differential input terminals.

8. A logarithmic amplifier as claimed in claim 7, wherein each of said half-wave rectifiers further includes a constant current source for driving said emitter-coupled transistor pair with unbalanced emitter-degeneration; and wherein, for each of said plurality of said full-wave rectifiers, the product of a resistance value of said emitter-degeneration resistor and a current value of said constant current source is unique.

9. A logarithmic amplifier comprising:

a plurality of M cascaded amplifier stages for respectively amplifying an input signal to produce respective amplified output signals;

a plurality of M logarithmic elements for generating intermediate logarithmic output signals in response to respective ones of said amplified output signals produced by said plurality of M cascaded amplifiers, each of said M logarithmic elements having at least two rectifiers for generating said intermediate logarithmic output signals, each of said rectifiers comprising a pair of differential transistors wherein emitter areas of transistors in each of said pair of differential transistors are substantially equal; and an adder for adding said intermediate logarithmic output signals generated by said plurality of M logarithmic elements.

10. A logarithmic amplifier as claimed in claim 9, wherein said intermediate logarithmic output signals generated by said logarithmic elements are composed of a plurality of signal components, and wherein said adder further adds said signal components in adding said intermediate logarithmic output signals from said logarithmic elements.

11. A logarithmic amplifier as claimed in claim 10, further comprising an additional logarithmic element for generating a logarithmic output signal in response to an initial input signal for said logarithmic amplifier.

12. A logarithmic amplifier as claimed in claim 11, wherein said at least two rectifiers are half-wave rectifiers whose input ends are cross-coupled and whose output ends are connected in parallel.

* * * * *